United States Patent
Zhang et al.

(10) Patent No.: US 11,538,666 B2
(45) Date of Patent: Dec. 27, 2022

(54) MULTI-ZONE COOLING OF PLASMA HEATED WINDOW

(71) Applicant: Lam Research Corporation, Fremont, CA (US)

(72) Inventors: Yiting Zhang, Fremont, CA (US); Richard Marsh, San Ramon, CA (US); Saravanapriyan Sriraman, Fremont, CA (US); Alexander Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 677 days.

(21) Appl. No.: 15/814,139

(22) Filed: Nov. 15, 2017

(65) Prior Publication Data

US 2019/0148118 A1   May 16, 2019

(51) Int. Cl.
*H01J 37/32* (2006.01)
*H01L 21/67* (2006.01)
*F25D 1/00* (2006.01)
*F25D 17/00* (2006.01)

(52) U.S. Cl.
CPC ......... *H01J 37/32522* (2013.01); *F25D 1/00* (2013.01); *F25D 17/005* (2013.01); *H01J 37/32119* (2013.01); *H01J 37/32449* (2013.01); *H01L 21/67109* (2013.01); *H01L 21/67248* (2013.01); *F25D 2700/16* (2013.01); *H01J 37/3211* (2013.01); *H01J 2237/002* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 6,284,051 B1 | 9/2001 | Fidelman | |
| 6,530,539 B2 | 3/2003 | Goldman et al. | |
| 6,563,092 B1 | 5/2003 | Shrinivasan et al. | |
| 8,038,835 B2 * | 10/2011 | Hayashi | H01J 37/3244 |
| | | | 118/715 |

(Continued)

OTHER PUBLICATIONS

International Search Report and Written Opinon for Application No. PCT/US2018/060240 dated Feb. 26, 2019.

(Continued)

*Primary Examiner* — Ram N Kackar

(57) ABSTRACT

A substrate processing system includes a multi-zone cooling apparatus to provide cooling for all or substantially all of a window in a substrate processing chamber. In one aspect, the apparatus includes one or more plenums to cover all or substantially all of a window in a substrate processing chamber, including under an energy source for transformer coupled plasma in the substrate processing chamber. One or more air amplifiers and accompanying conduits provide air to the one or more plenums to provide air flow to the window. The conduits are connected to plenum inlets at various distances from the center, to direct airflow throughout the window and thus address center hot, middle hot, and edge hot conditions, depending on the processes being carried out in the chamber. In one aspect, the one or more plenums include a central air inlet, to direct air toward the center portion of the window, to address center hot conditions.

19 Claims, 13 Drawing Sheets

(56) References Cited

U.S. PATENT DOCUMENTS

| | | |
|---|---|---|
| 8,721,791 B2 * | 5/2014 | Tiner ................ C23C 16/45565 |
| | | 118/715 |
| 8,901,518 B2 | 12/2014 | Ranish et al. |
| 2002/0185229 A1 | 12/2002 | Brcka et al. |
| 2013/0087283 A1 | 4/2013 | McChesney et al. |
| 2013/0228283 A1 * | 9/2013 | McChesney ....... H01J 37/32119 |
| | | 156/345.27 |
| 2016/0104604 A1 | 4/2016 | Kim et al. |
| 2016/0293382 A1 * | 10/2016 | Sato ................. H01J 37/32174 |
| 2017/0009338 A1 | 1/2017 | Saito et al. |
| 2017/0103875 A1 | 4/2017 | McChesney et al. |

OTHER PUBLICATIONS

Taiwanese Office Action for Taiwan Application No. 107140157 dated Apr. 21, 2022.

* cited by examiner

MULTI-ZONE COOLING OF PLASMA HEATED WINDOW

FIELD

The present disclosure relates to substrate processing systems, more particularly to cooling of chamber windows in substrate processing systems, and yet more particularly to air circulation for cooling of chamber windows in substrate processing systems. Still more particularly, the present disclosure relates to plenum structures and associated apparatus for cooling of chamber windows in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching and/or other treatment of substrates such as semiconductor wafers. A substrate may be arranged on a pedestal in a processing chamber of the substrate processing system. For example, during etching in a plasma etcher, a gas mixture including one or more precursors is introduced into the processing chamber and plasma is struck to etch the substrate.

As substrate processing technology advances, and processes drop below 10 nm, there is increased demand for high-density substrate processing chambers. Ever higher power transformer coupled plasma (TCP) is needed. For example, in processes such as 3D NAND mask opening, high bias (>2500 Watt) TCP is used, with narrow ion angular distribution. In other examples, such as chamber conditioning or photoresist trimming, high pressure, high power (>3000 Watt) TCP may be needed, in order for sufficiently large high-energy ion fluxes to reach a substrate surface and thus reduce process time.

One consequence of such high power, high density processes is that high-energy ion flux will bombard not only the substrate, but also the ceramic/dielectric window underneath the TCP coils. Such bombardment will heat the window. Depending on the process being used, different parts of the window may undergo significant heating at different times. Air circulation apparatus helps to cool down portions of a window. However, with the variation in processes that may be used, some window portions may receive a lot of heat, but the air circulation apparatus does not provide sufficient cooling. As a result, there is a substantial risk that the window may crack, damaging the chamber and taking expensive equipment out of circulation pending repair.

Attempts have been made to facilitate air circulation more widely across the window, to promote more even temperature (or at least fewer hotspots), and to attempt to address process conditions which can lead to so-called center hot, middle hot, or edge hot conditions. However, to date, such attempts have left window areas susceptible to extreme temperature differentials, risking damage to the window and/or the chamber.

It would be desirable to provide a multi-zone cooling apparatus which better addresses hotspots in a dielectric window while the substrate processing chamber is in use.

SUMMARY

In one aspect, a substrate processing system includes a multi-zone cooling apparatus that provides cooling for all or substantially all of a window in a substrate processing chamber. In one aspect, the apparatus includes one or more plenums to cover all or substantially all of a window in a substrate processing chamber, including under an energy source for transformer coupled plasma in the substrate processing chamber.

In one aspect, one or more air amplifiers and accompanying conduits provide air to the one or more plenums to provide air flow to the window. In one aspect, the conduits are connected to plenum inlets at various distances from the center, to direct air throughout the window and thus address center hot, middle hot, and edge hot conditions, depending on the processes being carried out in the chamber. In one aspect, the plenum includes a central air inlet, to direct air toward the center portion of the window, to address center hot conditions.

In one aspect, with the one or more plenums covering all or substantially all of the window, some of the conduits connected to air amplifiers can be moved toward the outer edge to address possible so-called "edge hot" conditions during some types of processes.

In one aspect, the one or more air amplifiers may be controlled separately. In one aspect, the separate control comes from separate valves, one or more for each conduit. There may be low flow valves and high flow valves. In one aspect, the separate control comes from on/off control of the air amplifiers.

In one aspect, configuration of an underside of the plenum provides different flow configurations, alone or in combination with positioning of the inlets on the top surface of the plenum.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
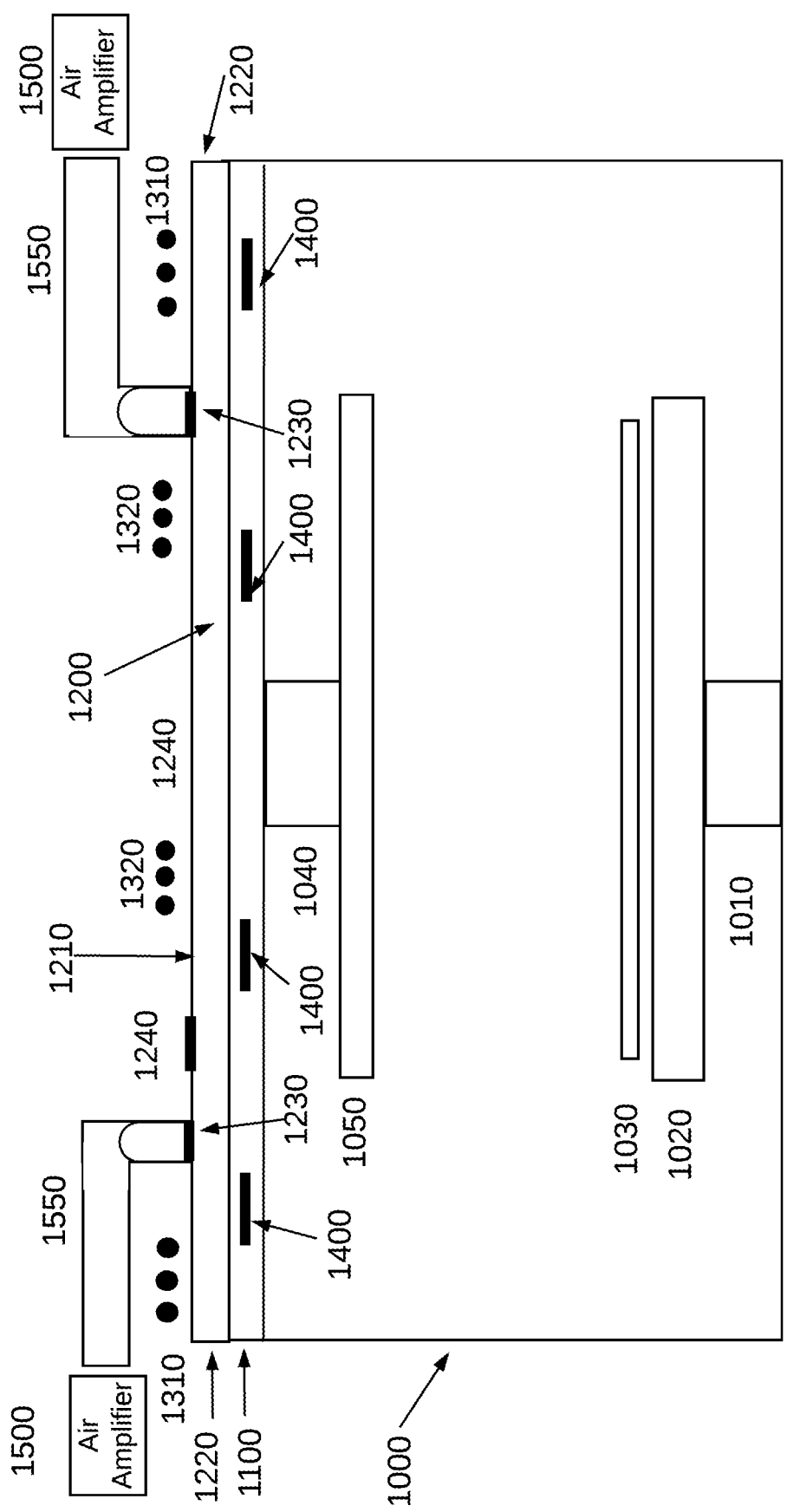
FIG. 1 is a functional block diagram of an example of a substrate processing chamber including a plenum and one or more air amplifiers according to an aspect of the present disclosure.

FIG. 1 shows elements of a substrate processing system according to one aspect of the present disclosure. The FIG. 1 substrate processing system includes a chamber 1000 with a pedestal 1010 and an electrostatic chuck (ESC) 1020, with a substrate 1030 depicted thereon. A plasma conduit 1040 leads to a showerhead 1050, for distributing plasma processing gas within the chamber 1000.

A dielectric window 1100 covers a top of the chamber 1000. The dielectric window 1100 is formed from a dielectric material that transmits electromagnetic energy. Suitable dielectric materials include quartz and ceramics comprising, for example, aluminum nitride (AlN), aluminum oxide (Al$_2$O$_3$), or any other refractory material having similar transmissive properties.

A plenum 1200, disposed over the dielectric window 1100, is sized to cover all or substantially all of the dielectric window 1100. Depending on what might best facilitate cooling, the plenum 1200 may be in direct contact with the dielectric window 1100, or may be positioned slightly above the dielectric window 1100, for example, from about 0.25 mm to about 2 mm.

In one aspect, the plenum 1200 has a top surface 1210 and side walls 1220, and one or more air inlets 1230 in the top surface 1210. In accordance with one aspect, one or more air outlets 1240 are provided. These outlets variously may be somewhere on the top surface 1210 (for example, in the middle or toward one side of the plenum 1200), or in one or more places in the side walls 1220.

An energy source 1300, which in one aspect (as shown more particularly in FIG. 2) is constituted by one or more coils 1310, 1320, is disposed above the plenum 1200, such that the plenum 1200 is interposed between the energy source 1300 and the window 1100. The energy source 1300 can include coils formed in any shape suitable to generate electromagnetic energy such as, for example, faceted concentric segments, concentric segments that are formed at angular turns with respect to one another, solenoid shaped conductors, toroid shaped conductors or combinations thereof.

The energy source 1300 can be capable of generating electromagnetic energy over a wide range of powers such as, for example in some embodiments about 50 W to about 20 kW, in one embodiment greater than about 2 kW, in another embodiment about 3 kW, or in yet another embodiment about 4.5 kW. In one aspect, the inner coil 1310 and the outer coil 1320 may be conductively coupled with one another. In other aspects, multiple coils can be powered by multiple radio frequency (RF) generators. While the energy source 1300 is depicted as a multi-coiled RF source, the energy source can be any device capable of generating electromagnetic energy to generate an inductively coupled plasma such as, but not limited to, a radio frequency (RF) source, electron cyclotron resonance (ECR), a microwave horn, slotted antennae, or helicon sources, which use a spiral antenna wrapped around a cylindrical window.

During operation, in one aspect, the energy source 1300 transmits electromagnetic energy through the dielectric window 1100 and into the chamber 1000 to transform at least a portion of the plasma processing gas into plasma. In different aspects, the plasma processing gas can come through an injector, or through an arrangement such as showerhead 1050 shown in FIG. 1, or any other suitable arrangement for distributing plasma processing gas appropriately in the chamber 1000. A portion of the electromagnetic energy is transformed into heat energy that can be absorbed by the dielectric window 1100. Specifically, some electromagnetic energy can be converted into heat according to the dielectric properties of the dielectric window 1100, and a further portion of the electromagnetic energy can be absorbed by the dielectric window 1100 after the plasma processing gases are ionized. For example, the plasma can heat the dielectric window 1100. Accordingly, the transmitted electromagnetic energy can increase the temperature of the dielectric window 1100. In one aspect, the electromagnetic energy is anisotropic, such that different portions of the dielectric window 1100 are subjected to varying amounts of electromagnetic energy. It is believed that the heat induced in the dielectric window 1100 can be correlated with the amount of electromagnetic energy transmitted through the dielectric window 1100. For example, in one aspect, the dielectric window 1100 can absorb greater than about 40% of the electromagnetic energy as heat. The dielectric window 1100 can absorb at least about 0.4 kW of electromagnetic energy as heat such as, for example, in one aspect greater than about 1 kW, in another aspect about 1.5 kW, or in yet another aspect about 2.25 kW. Accordingly, an elevated temperature region, or hot spot, can be formed in the portion of the dielectric window 1100 that is subjected to a relatively high amount of heat induced by the electromagnetic energy with respect to the other portions of the dielectric window 1100.

Substrate processing systems can implement a number of processes, resulting in different temperature conditions at the dielectric window 1100. Some of these temperature conditions can cause large temperature discrepancies across the dielectric window 1100, making the dielectric window 1100 susceptible to cracking. To facilitate monitoring of temperature at the dielectric window 1100, one or more temperature sensors 1400 may be disposed within window 1100. In FIG. 1, four such temperature sensors 1400 are shown. However, the number of temperature sensors 1400 is not critical. What matters is that there are sufficient sensors 1400 to measure temperature in zones of the window 1100 where hot spots may occur.

In one aspect, the plenum 1200 is formed from a passive material such as, for example, polytetrafluoroethylene (PTFE or "teflon"), polyether ether ketone (PEEK), polyetherimide (PEI or "ultem"), ceramics, or any other electromagnetic energy transmissive material, and other materials are also possible. As a result, electromagnetic energy transmitted from the coils 1310, 1320 can reach the dielectric window 1100 without interference from the plenum 1200, and without adverse effect on the plenum 1200.

In one aspect, the substrate processing system includes one or more air amplifiers 1500 with associated conduits 1550 connected to air inlets 1230. FIG. 1 shows two such air amplifiers 1500 and conduits 1550. The air inlets 1230 and conduits 1550 are positioned in different locations on top plenum surface 1210, with the conduit/inlet pair on the left hand side of FIG. 1 being closer to an edge of the dielectric window 1100, and the conduit/inlet pair on the right hand side of FIG. 1 being closer to a middle portion of the dielectric window 1100. The respective positioning is such that the conduit/inlet pair on the left hand side of FIG. 1 may be better able to address edge hot conditions at the dielectric window 1100, while the conduit/inlet pair on the right hand side of FIG. 1 may be better able to address middle hot conditions at the dielectric window 1100.

According to aspects of the present disclosure, air supplied through plenum 1200 is a medium for providing cooling. It will be apparent to ordinarily skilled artisans that other cooling mechanisms and cooling media may be used in addition to the air amplifier 1500-plenum 1200 structure.

Figure 2:
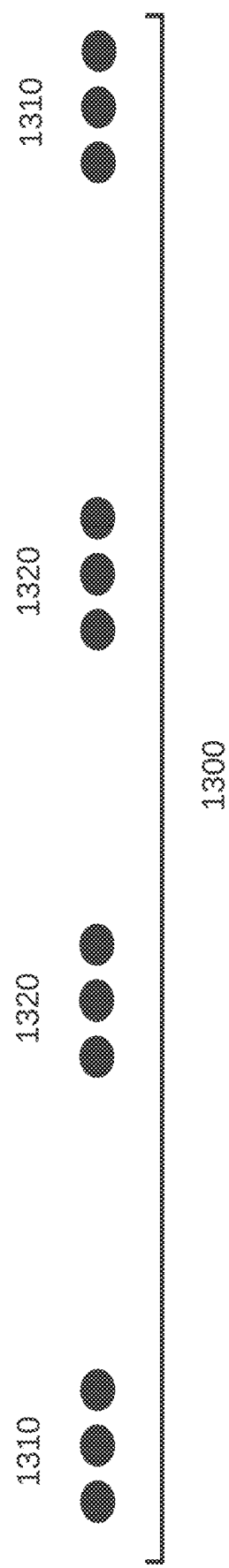
FIG. 2 is a conceptual view of an example of an energy source according to an aspect of the present disclosure.

FIG. 2 is a representational view of one example of an energy source 1300 according to an embodiment. In FIG. 2, energy source 1300 is shown as including coils 1310, 1320. As discussed earlier, other types of energy sources may be suitable according to aspects of the present disclosure.

Figure 3:
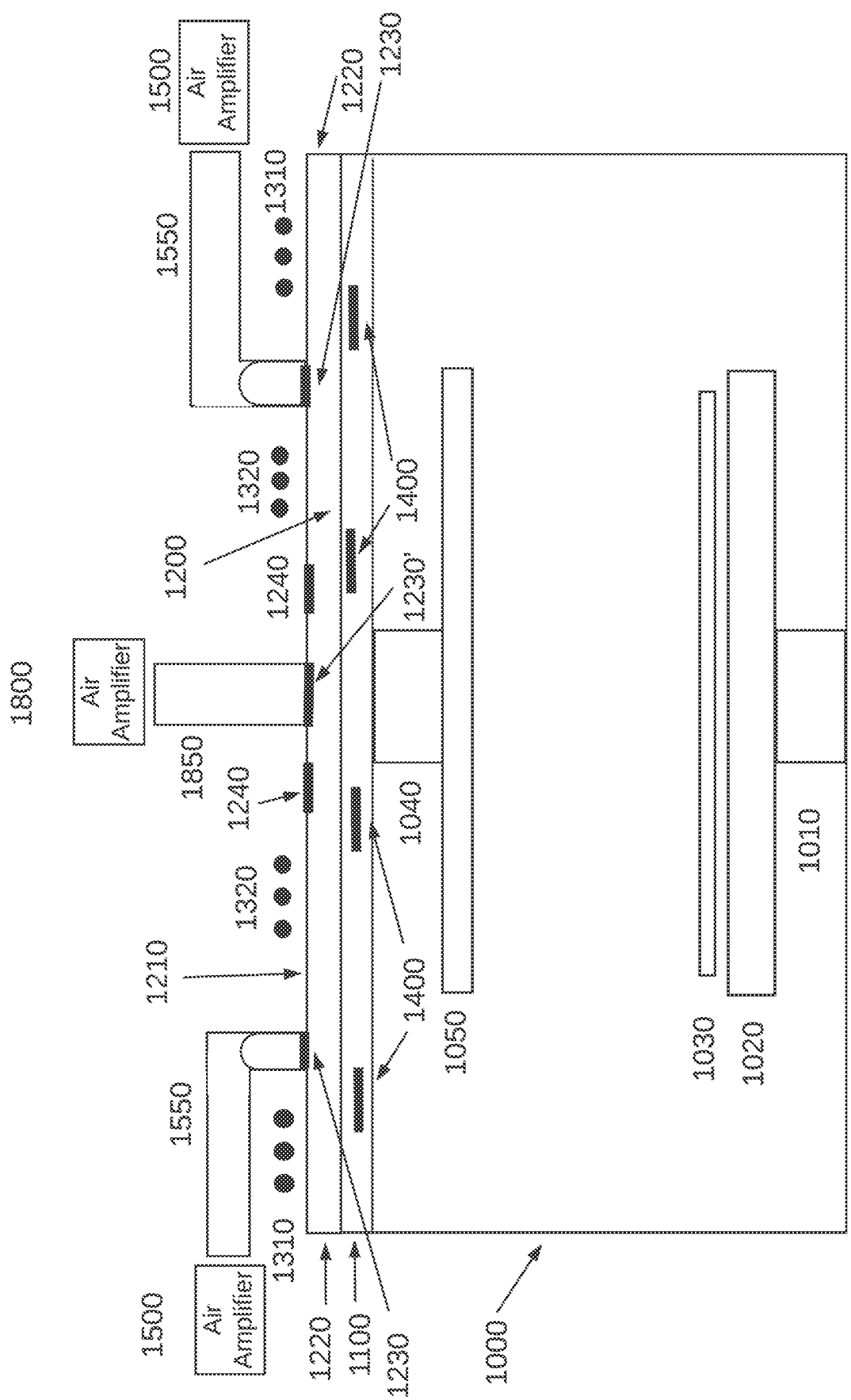
FIG. 3 is a functional block diagram of an example of a substrate processing chamber including a plenum and one or more air amplifiers, and including a center air inlet, according to an aspect of the present disclosure.

FIG. 3 shows elements of a substrate processing system similar to those shown in FIG. 1. In place of air outlet 1240 in the middle of the plenum 1200, there is a further air inlet 1230', and a further air amplifier 1800, connected to air inlet 1230' via conduit 1850.

The central air inlet 1230', shown also in FIG. 4 below, along with the associated conduit and air amplifier structure, makes it possible to address important center hot conditions that temperature sensor(s) 1400 detect during certain processes. In one aspect, providing temperature sensors 1400 in multiple regions around the window 1100 can help detect hotspots in multiple areas. Because newer processes can create more intense hotspots in different locations, it is important to provide cooling capability throughout the entire surface of window 1100. Spreading air inlets and associated conduits more broadly across the surface of window 1100, as facilitated by the provision of plenum 1200 which extends across substantially all the entire surface of window 1100, yields improved cooling.

Figure 4A:
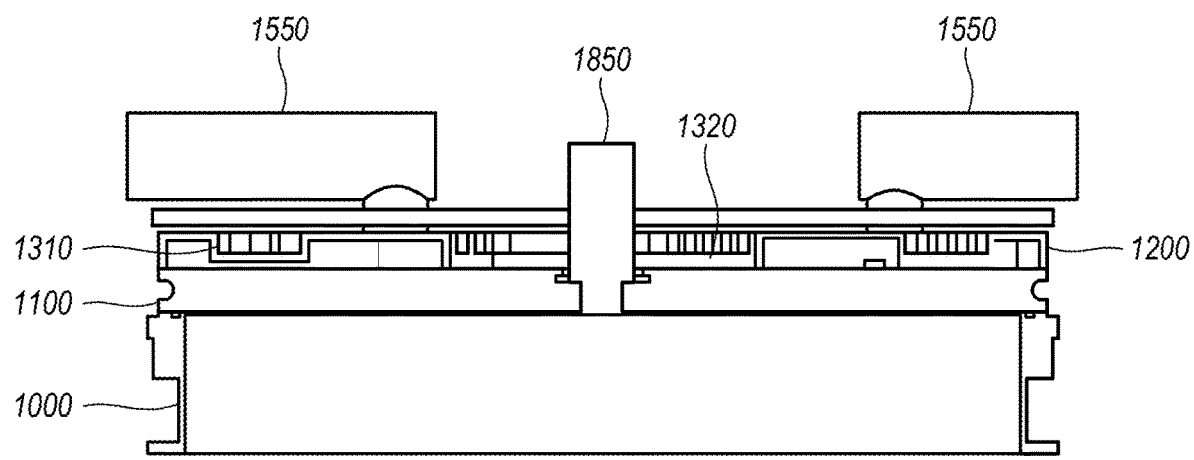
FIGS. 4A and 4B are three dimensional views of examples of a substrate processing chamber including a plenum and one or more air amplifiers according to aspects of the present disclosure.

FIG. 4A shows a three-dimensional view of a substrate processing system according to an aspect of the present disclosure. In FIG. 4A, the positioning of coils 1310, 1320 relative to plenum 1200, and in particular the interposition of plenum 1200 between coils 1310, 1320 and dielectric window 1100 is more apparent. Two conduits 1550, 1550 and conduit 1850 address middle hot and center hot conditions in dielectric window 1100.

Figure 4B:
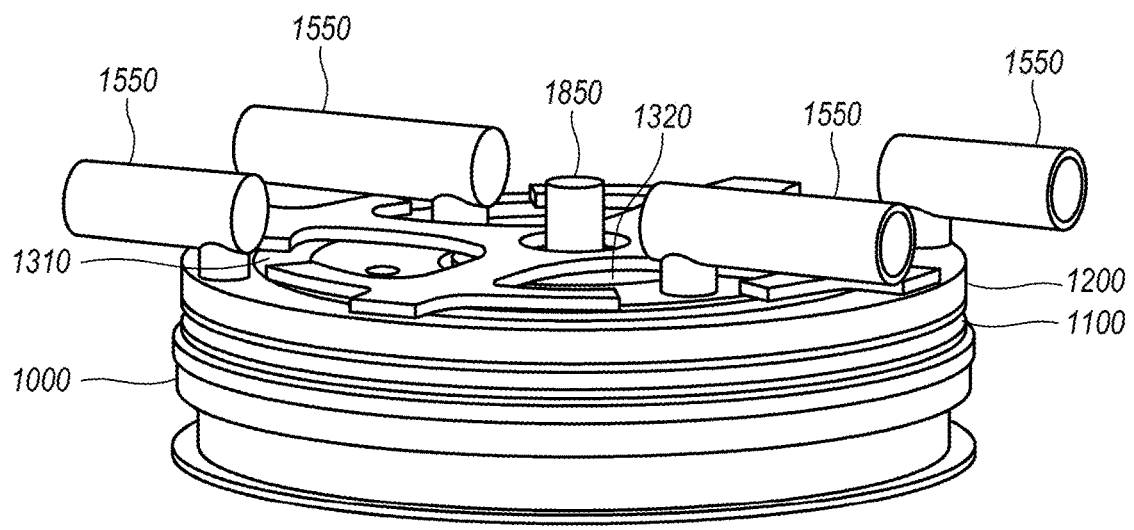
Figure 5A:
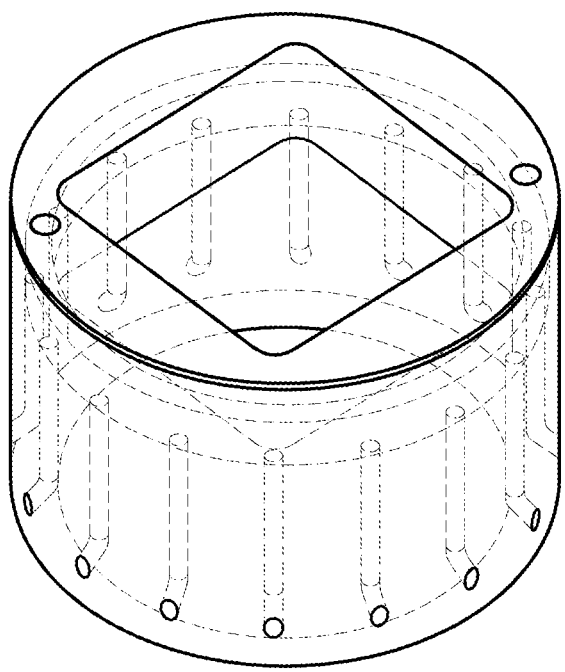
FIGS. 5 A-D are renderings of a plan view, a side view, a top view, and a bottom view, respectively, of a central air inlet according to one aspect of the present disclosure.
Figure 5B:
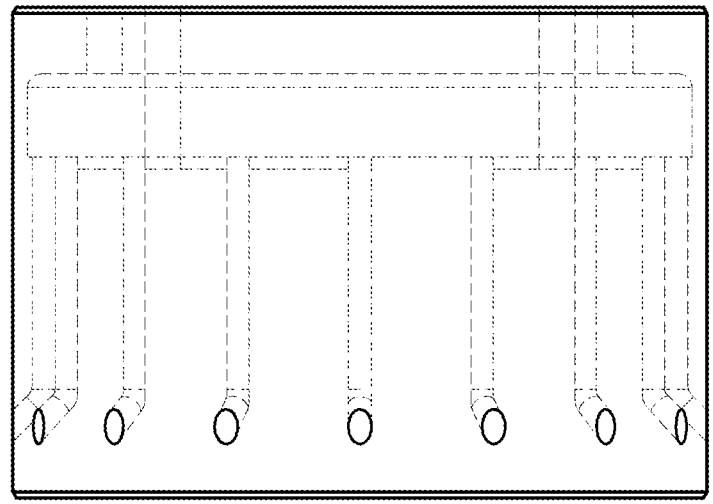
Figure 5C:
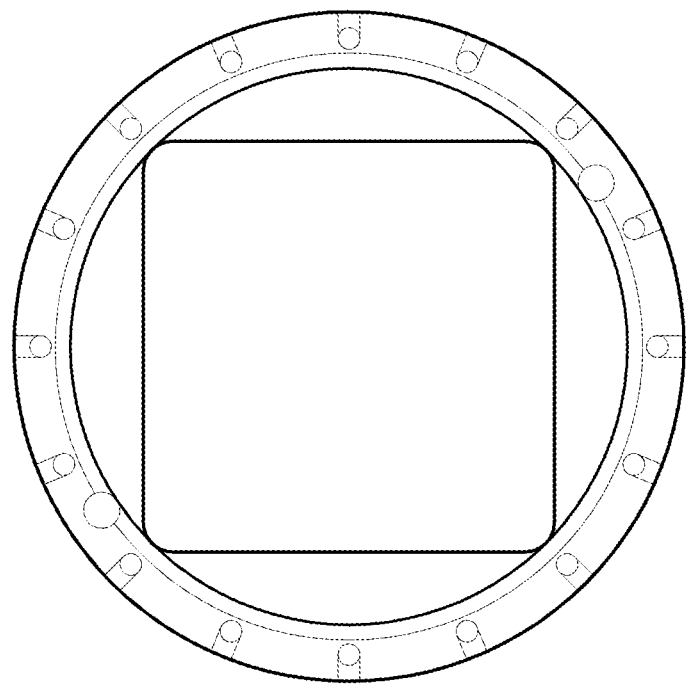
Figure 5D:
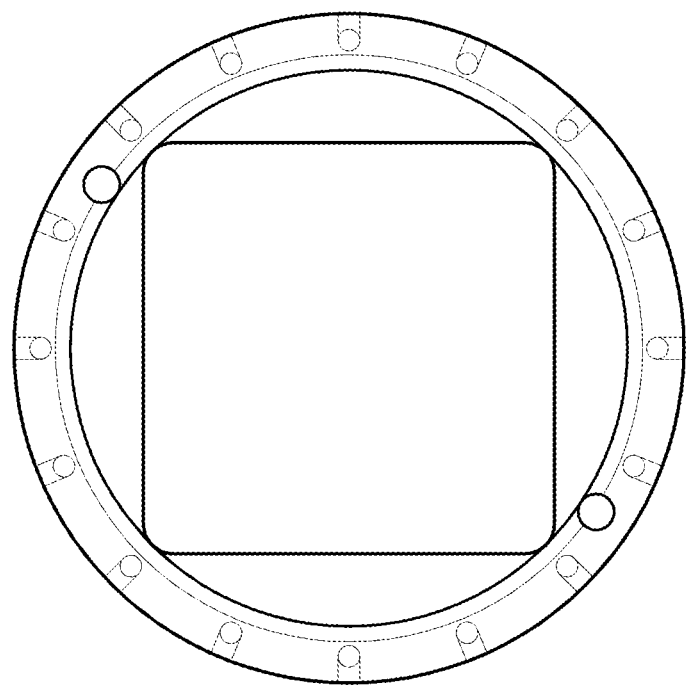

FIG. 4B shows a three-dimensional view of a substrate processing according to an aspect of the present disclosure. In FIG. 4B, four conduits 1550 provide air to different zones of the window 1100 via plenum 1200. The conduits 1550 on the far left and right hand sides of FIG. 4B show a positioning to address edge hot conditions in window 1100. The conduits 1550 toward the middle of FIG. 4B show a positioning to address middle hot conditions in dielectric window 1100. Conduit 1850 addresses center hot conditions in dielectric window 1100.

The air amplifiers for these various conduits may be located on various sides of the substrate processing system, depending on where the placement of the conduits might make sense. In addition, the number of conduits shown does not constitute a limit. The plenum 1200 may have its underside split into sections to facilitate air flow to certain areas of the window 1100. In that event, additional air inlets and conduits may be provided, to handle air flow in the individual sections. Even if the underside of plenum 1200 is not split into sections, but merely has side walls and no other protrusions or extensions (other than possibly for structural stability, for example), additional air outlets and associated conduits and air amplifiers may be provided to provide further improvement to air flow across the surface of window 1100.

Also in FIG. 4 is a central air inlet 1850, which enables flow of air to a central portion of window 1100, thereby addressing center hot conditions during certain processes. With configurations and arrangements of plenums around rather than under RF coils, and the arrangement of RF coils in varying numbers and at varying diameters over a window, achievement of center cooling through placement of a central air outlet was not possible. With a plenum in accordance with aspects of the present disclosure, that central air inlet placement is possible, thereby facilitating the handling of center hot conditions resulting from certain processes.

Figure 6:
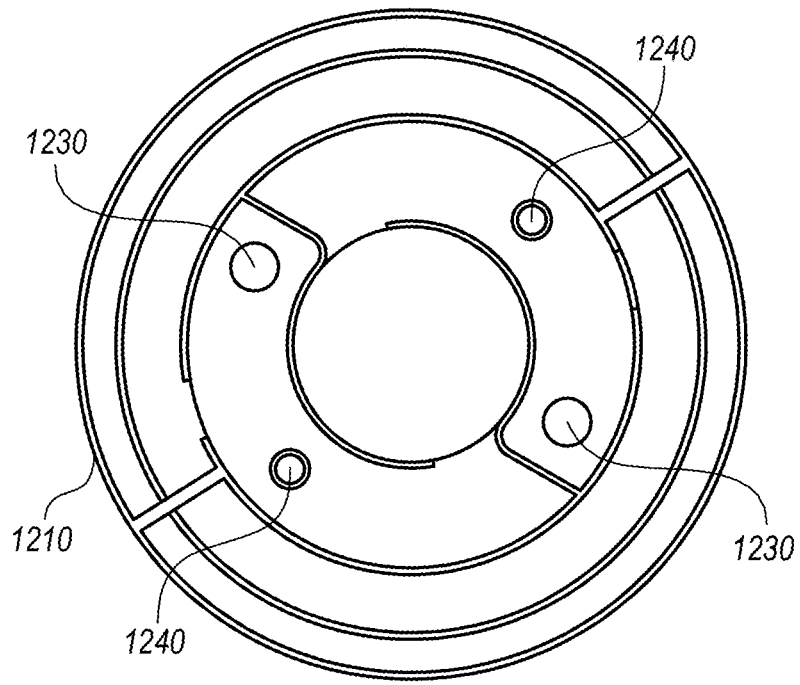
FIG. 6 is a top view of a plenum according to an aspect of the present disclosure.
Figure 7:
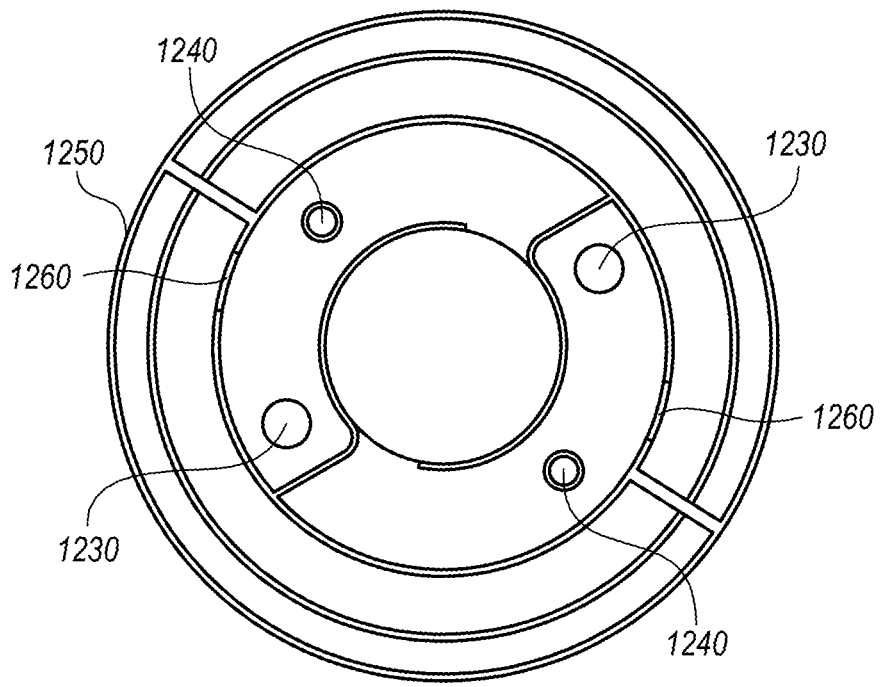
FIG. 7 is a bottom view of a plenum according to an aspect of the present disclosure.

FIGS. 5A-5D show various views of a central air inlet 1850 according to an aspect of the present disclosure. An outer perimeter of the central air inlet 1850 is round, though this is not critical to the ability to locate the central air inlet on 1850 the plenum 1200. In addition, a profile of an inner perimeter of the central air inlet 1850 in FIGS. 5A-5D is square, but again this is not critical. The central air inlet 1850 can contain outlet holes of varying shape, in varying locations, to address different cooling needs FIGS. 6 and 7 show respective top and bottom views of the plenum 1200 in accordance with an aspect of the present disclosure. In FIG. 6, a top surface 1210 of plenum 1200 has air inlets 1230 and air outlets 1240. In FIG. 7, a bottom surface 1250 of plenum 1200 has the air inlets 1230 and air outlets 1240, but also air outlets 1260 to provide air flow within the plenum 1200 and over the dielectric window 1100.

In FIGS. 6 and 7, there are two air inlets, which may be connected to respective conduits, and thence to respective air amplifiers. There may be additional air inlets connected to additional conduits and to respective air amplifiers.

Figure 8A:
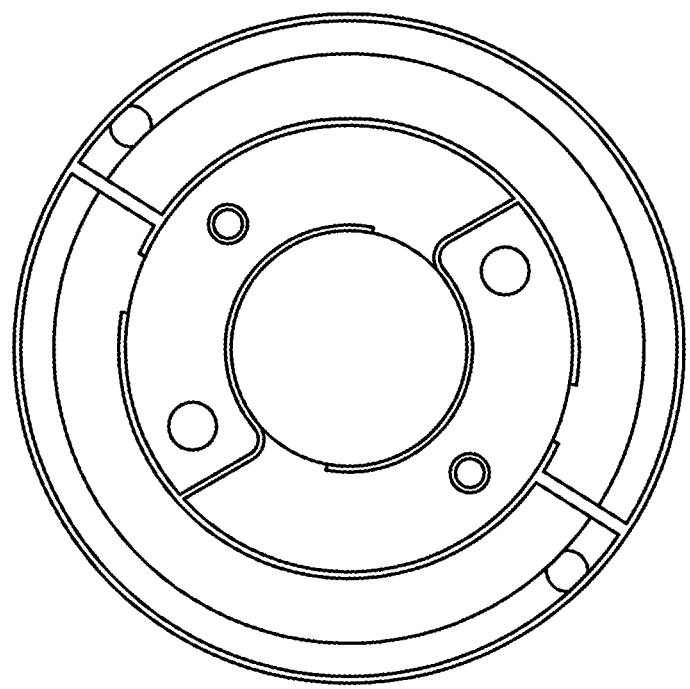
FIGS. 8A and 8B are bottom views of a plenum according to an aspect of the present disclosure.
Figure 8B:
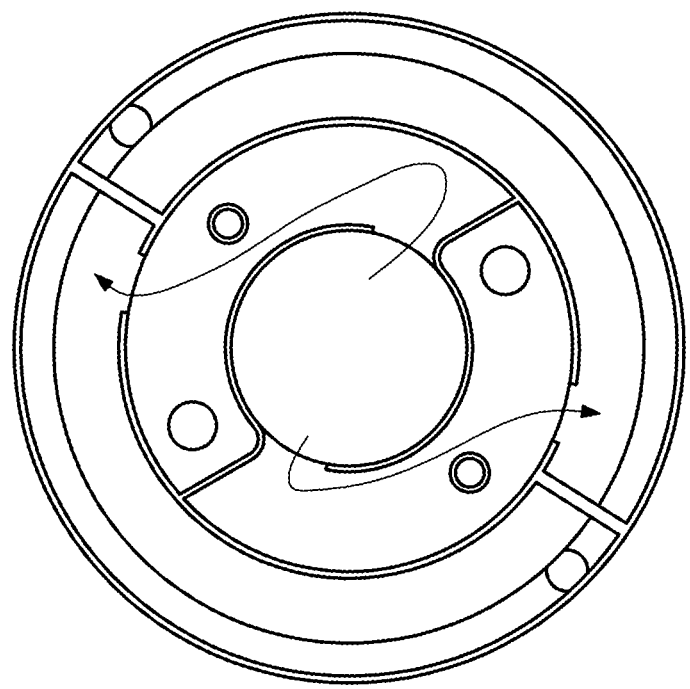

FIGS. 8A and 8B show bottom views of one plenum according to aspects of the present disclosure, similarly to FIGS. 6 and 7. FIG. 8B shows flow arrows indicating air flow in view of the positioning of air outlets.

Figure 9A:
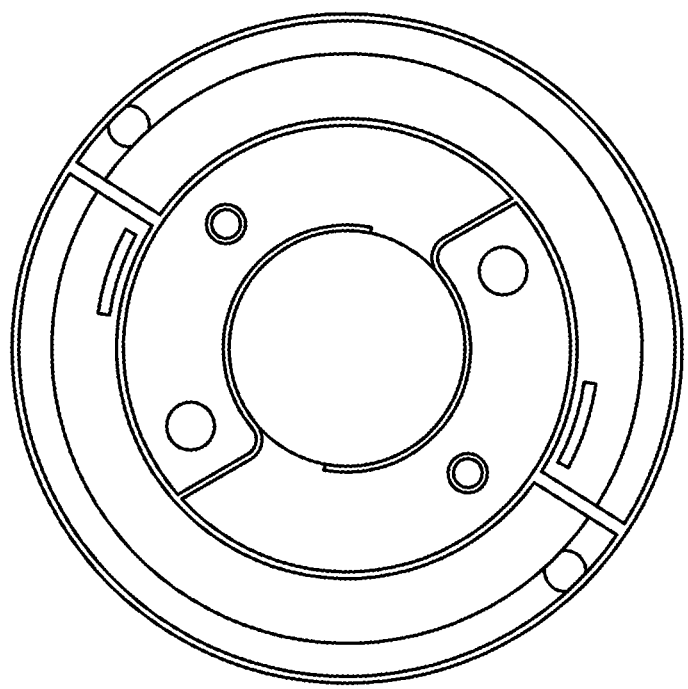
FIGS. 9A and 9B are bottom views of a plenum according to an aspect of the present disclosure.
Figure 9B:
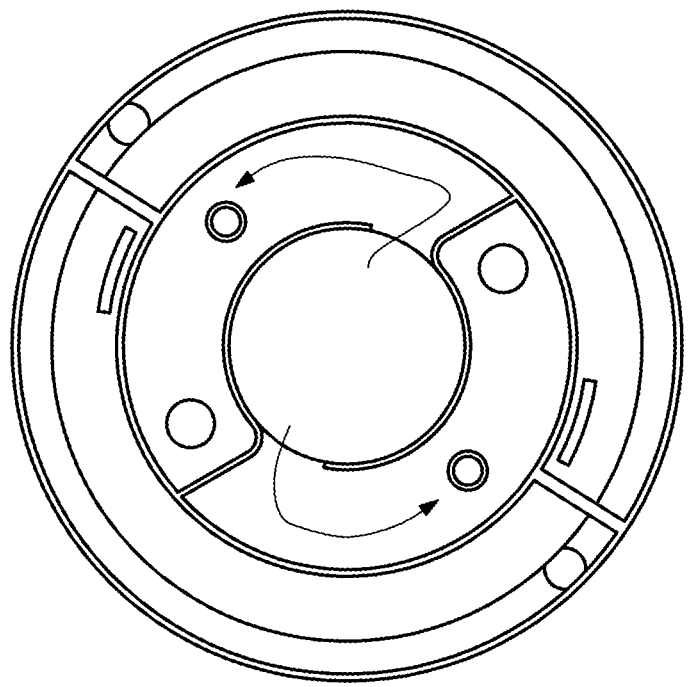

FIGS. 9A and 9B show bottom views of another plenum according to aspects of the present disclosure, with air outlets positioned differently from the positioning in FIGS. 8A and 8B. FIG. 9B shows flow arrows indicating air flow in view of the positioning of air outlets.

Figure 10A:
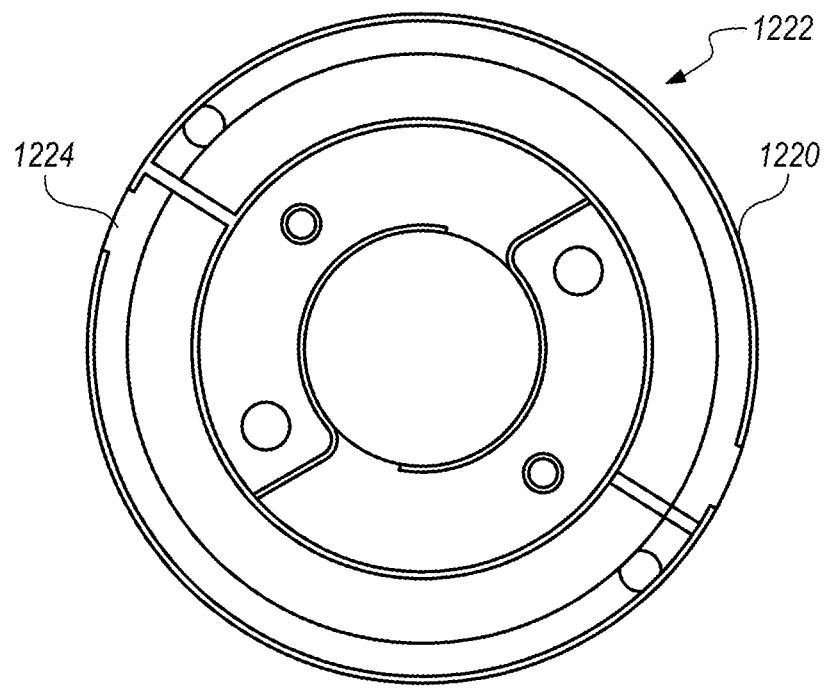
FIGS. 10A and 10B are bottom views of a plenum according to an aspect of the present disclosure.
Figure 10B:
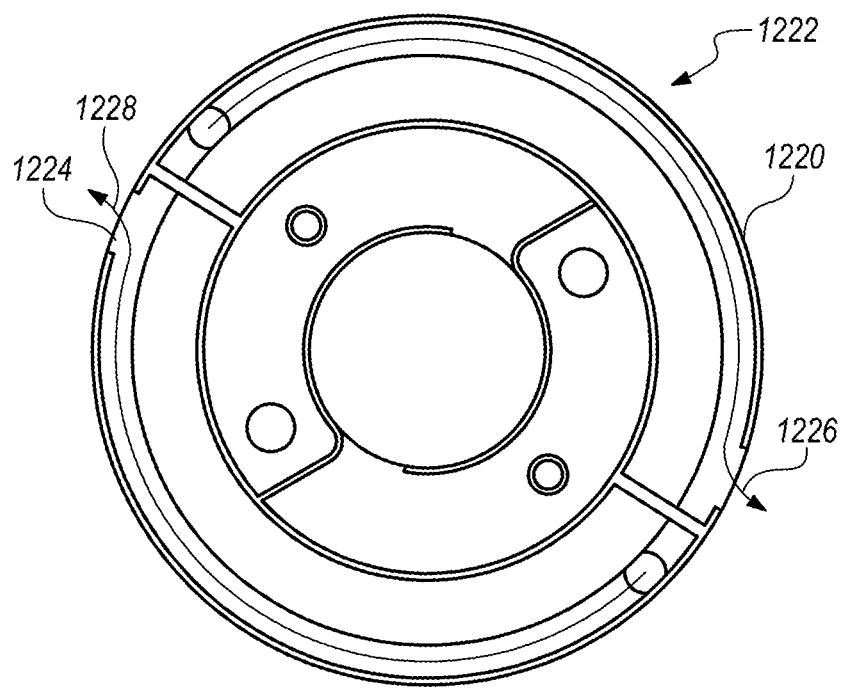

FIGS. 10A and 10B show bottom views of yet another plenum according to aspects of the present disclosure, with air outlets again positioned differently from the positioning in FIGS. 8A&B and 9A&B. Unlike those figures, there are two air outlets 1222, 1224 at side walls 1220 of FIGS. 10A and 10B. FIG. 10B shows flow arrows 1226, 1228 indicating air flow in view of the positioning of air outlets.

Various configurations of plenum 1200 have been shown and described. In terms of assembly, the plenum 1200 itself could be formed as a single piece, or as multiple segments which can be assembled together. In the case of a circular plenum, the segments could be wedge shaped, or arc shaped, or circumferential.

Figure 11:
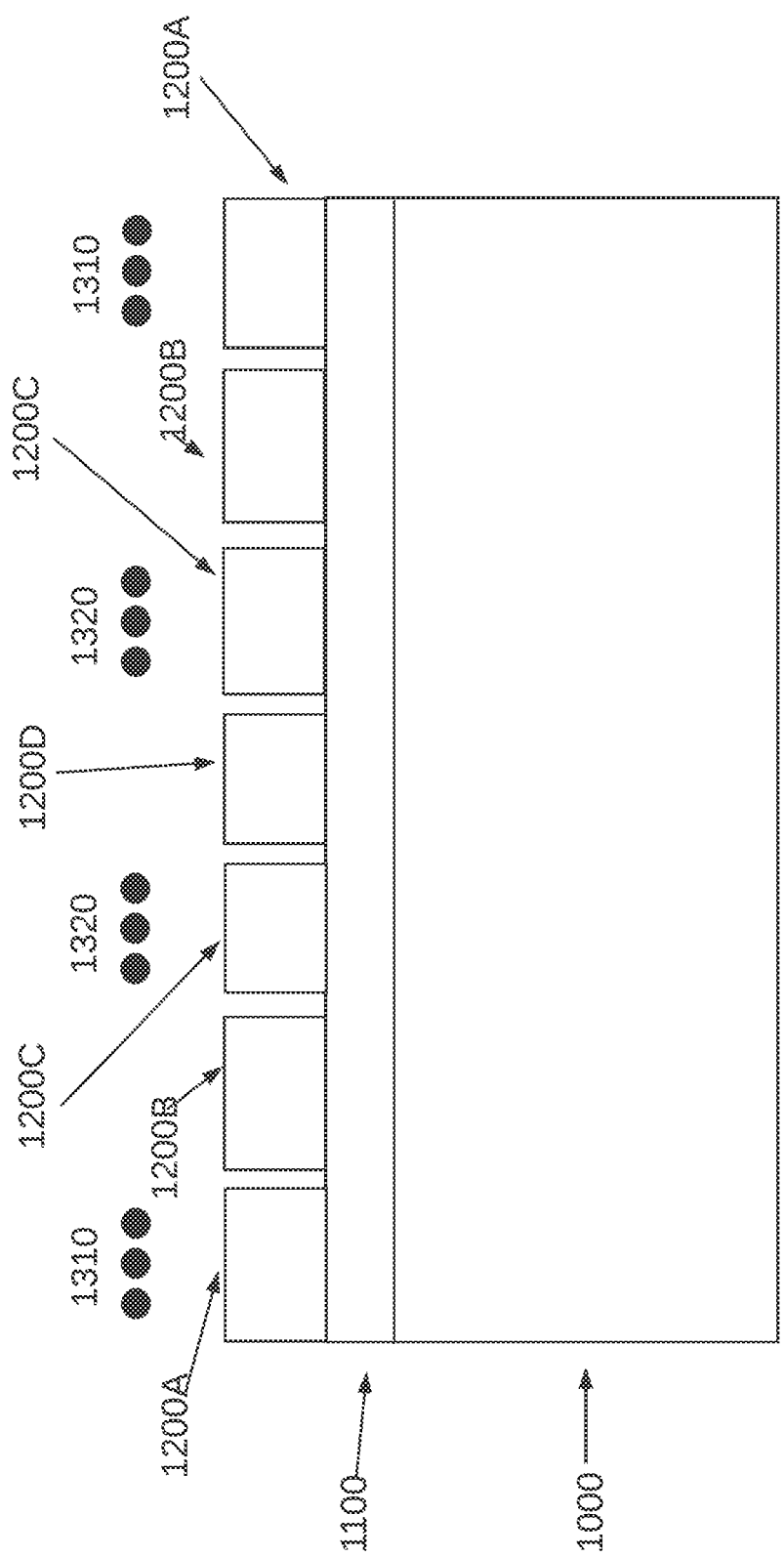
FIG. 11 is a high-level diagram of plenum structure according to one aspect of the present disclosure.

FIGS. 1 and 3 show structure for a single plenum 1200 covering substantially all of the upper surface of dielectric window 1100. FIGS. 6, 7, 8A, 8B 9A, 9B, 10A, and 10B also show a single plenum structure. According to aspects of the present disclosure, multiple plenums may cover substantially all of that upper surface. FIG. 11 shows plenums 1200A, 1200B, 1200C, and 1200D covering essentially the same surface as does plenum 1200 in the just-mentioned Figures. For simplicity of illustration, FIG. 13 omits the various air amplifier and coil structures.

Figure 12:
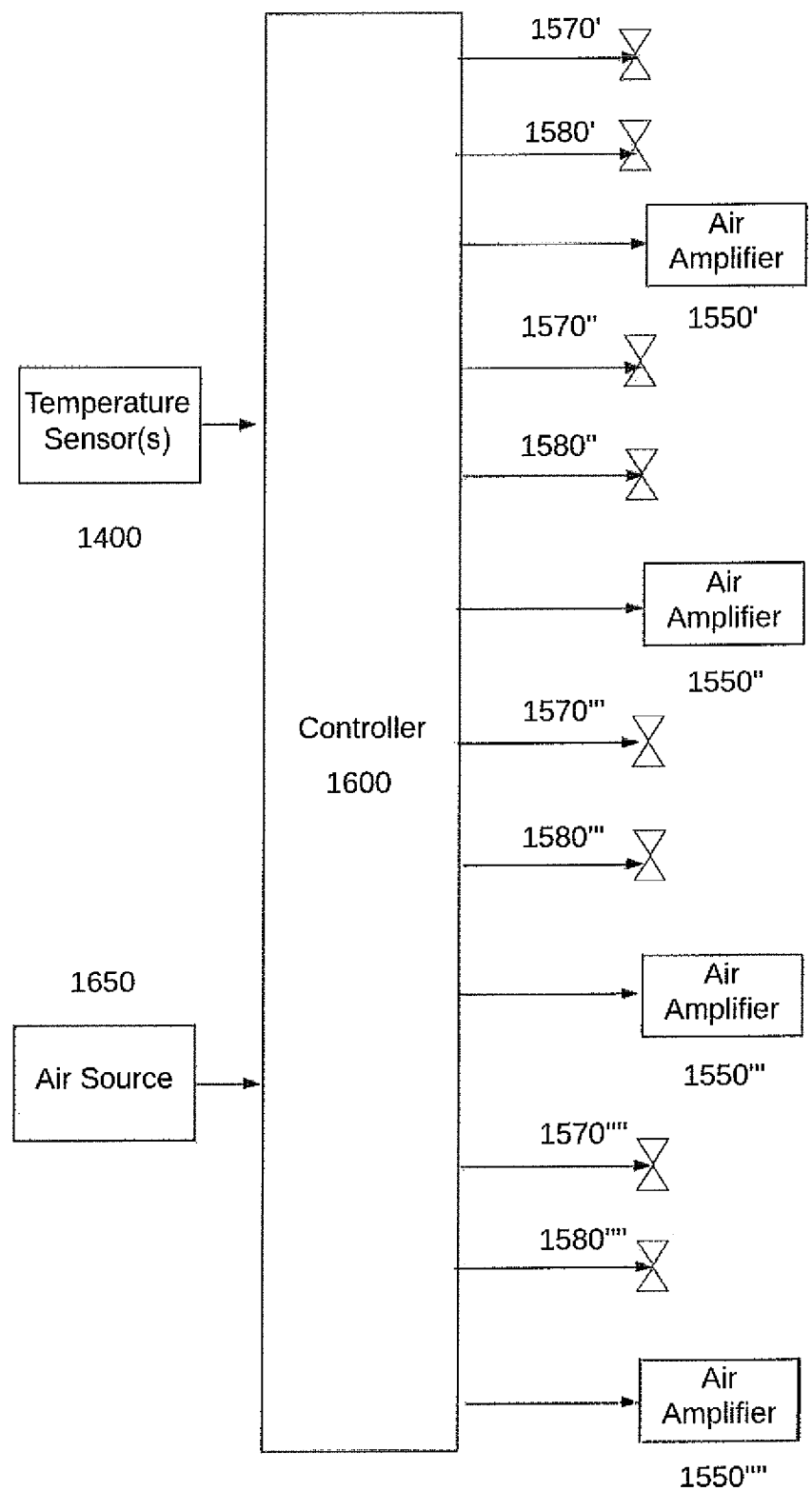
FIG. 12 is a high-level block diagram of a controller for operating the air amplifiers and valves according to an aspect of the present disclosure.

In FIG. 12, a controller 1600 controls operation of air amplifiers 1550', 1550'', 1550''', and 1550'''', discussed earlier in connection with air flow through the plenum 1200 according to an aspect of the present disclosure. In one aspect, the air amplifiers can be turned on and off as a group, or separately. They may have their operation modulated (e.g. low, medium, high) where the amplifiers have motors so configured to allow for that mode of operation, according to one aspect.

FIG. 12 also shows low flow valves 1570', 1570'', 1570''', and 1570'''', associated with respective air amplifiers 1550', 1550'', 1550''', and 1550'''', in accordance with one aspect of the disclosure. With some types of air amplifiers, if a small amount of air flow is needed, either selectively in certain areas because of localized hotspots resulting from certain processes, or more generally, one or more of the low flow valves, positioned between its associated air amplifier and a source of air, may control the amount of air admitted to the associated air amplifiers, and hence to the respective air inlets at plenum 1200.

FIG. 12 also shows high flow valves 1580', 1580'', 1580''', and 1580'''', again associated with respective air amplifiers 1550', 1550'', 1550''', and 1550'''', in accordance with one aspect of the disclosure. If a small amount of air flow is needed, either selectively in certain areas because of localized hotspots resulting from certain processes, or more generally, one or more of the high flow valves, positioned between its associated air amplifier and a source of air, may control the amount of air admitted to the associated air amplifiers, and hence to the respective air inlets at plenum 1200.

With the low flow valves and high flow valves, different amounts of air may be pumped into plenum 1200, according to perceived need, as indicated by outputs of temperature sensor(s) 1400.

In one aspect, controller 1600 also controls the operation of an air source 1650, which provides air to the air amplifiers. In one aspect, controller 1600 need not be dedicated to operational control of air flow, but instead may control other aspects of operation of the substrate processing chamber.

Air flow that the air amplifiers may provide, alone or in conjunction with the low flow and/or high flow valves, can vary depending on the air flow needs, which in turn can depend on the process or combination of processes being carried out. In one aspect, each air amplifier can provide suitable air flow when supplied with pressurized air having a pressure from about 20 psig to about 100 psig such as, for example, in one aspect about 25 psig to about 80 psig, in another aspect about 30 psig, or in another aspect about 50 psig. The air amplifier can provide suitable amounts of cooling air 70 at a rate of at least about 20 elm such as, for example, in one aspect about 20 cfm to about 3,000 cfm, in another aspect about 25 cfm to about 900 cfm, in yet another aspect about 30 cfm to about 230 cfm or in a further aspect about 125 cfm to about 230 cfm.

Figure 13:
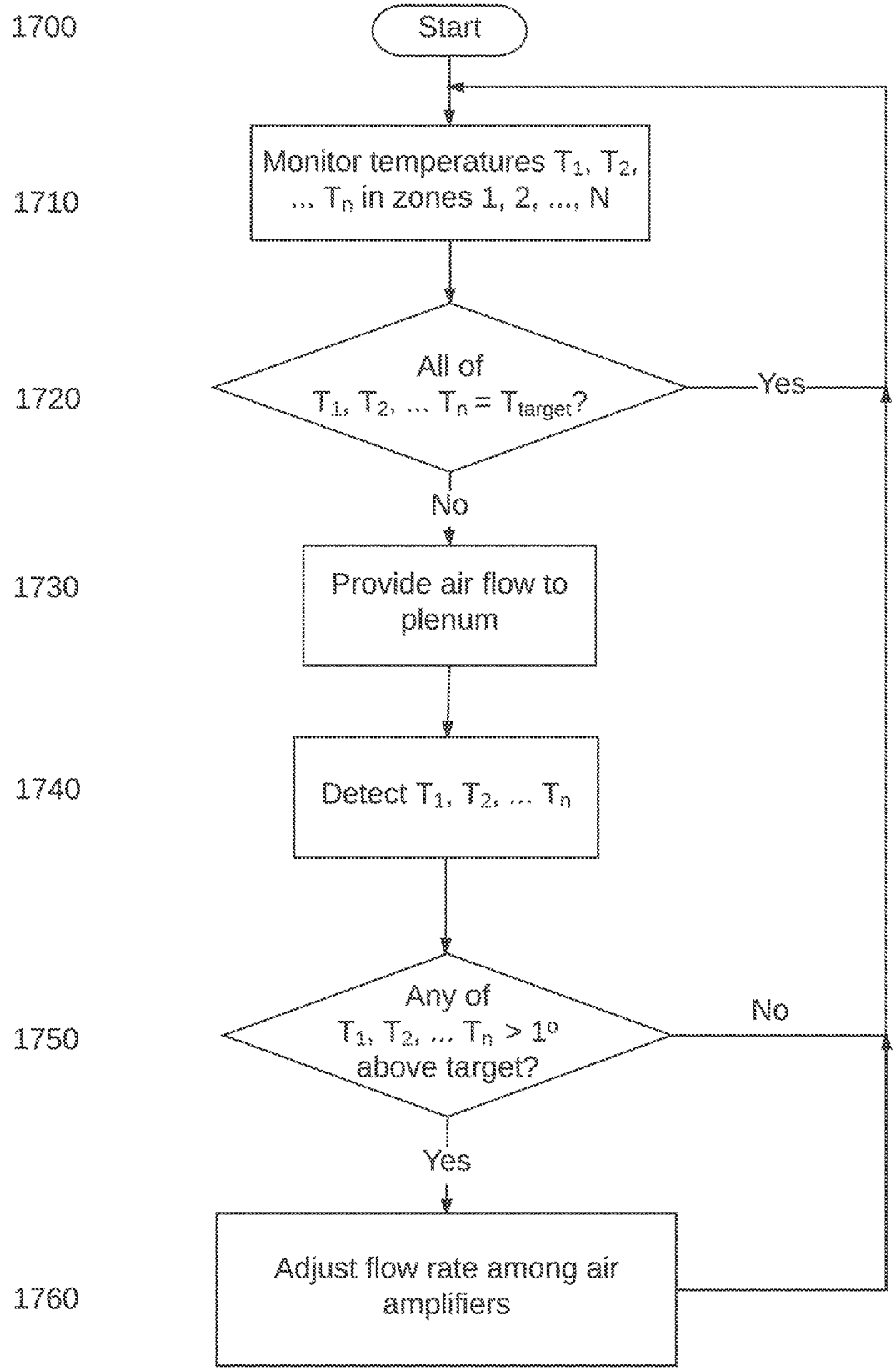
FIG. 13 is a flowchart illustrating steps of an example of a method for operating the air amplifiers and valves according to an aspect of the present disclosure; and In the drawings, reference numbers may be reused to identify similar and/or identical elements.

FIG. 13 is a flowchart illustrating operational control of air flow in a substrate processing system according to aspects of the present disclosure. Control starts at 1700. At 1710, temperature sensor 1400 senses temperatures in various zones of window 1100. As noted earlier, different temperature sensors may provide temperature information about different zones of the window. In one aspect, controller 1600 receives temperature information regarding a center region, a middle region, and an edge region to ascertain possible center hot, middle hot, and edge hot situations.

At 1720, if all of the temperatures are at their target, monitoring simply continues. If any of the temperatures is above target, then at 1730 controller 1600 operates to provide air flow to plenum 1200. Again as noted earlier, controller 1600 effects this operation either by modulating operation of one or more of the air amplifiers, or by controlling one or more low flow or high flow valves which admit air to the air amplifier, thereby effecting air flow to the plenum.

At 1740, the temperature sensor(s) 1400 provide temperature information to controller 1600, which then, at 1750, ascertains whether any of the temperatures in any of the target zones are above target, for example, by more than 1° C. If not, temperatures continue to be monitored. In one aspect, controller 1600 may operate to limit or shut off one or more of the air amplifiers previously activated. If any of the measured temperatures continues to be too high, at 1760 the controller 1600 operates to adjust flow rates among the air amplifiers.

With respect to the present disclosure, there is no particular requirement that the number of air amplifiers equal the number of air inlets. In one aspect, multiple air inlets can share the same air amplifier, depending on the processes being carried out. There likewise is no particular requirement that the number of air inlets equal the number of air outlets. Any combination of numbers of air amplifiers, air inlets, and air outlets that can generate sufficient air flow to address hotspots anywhere on the surface of window 1100, including in areas underneath RF coils, as the plenum disclosed herein enables, will be acceptable, because of the plenum's ability to provide air flow in those areas directly, among other things.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

The terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some aspects, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:
1. A substrate processing system comprising:
   a processing chamber having a window at a top portion thereof and covering the processing chamber;
   a first coil positioned above the window, the first coil to generate electromagnetic energy to ionize plasma processing gases in the processing chamber;
   first, second, and third air amplifiers to generate airflow when activated;
   a plenum positioned beneath the first coil and above the window, the plenum having side walls and also having a top surface substantially equal in area to an area of an upper surface of the window, the top surface having a first air inlet positioned at about a center portion of the top surface of the plenum to receive the airflow from the first air amplifier, the first air inlet including multiple holes to distribute the air across the window within the side walls of the plenum so as to reduce hotspots at a center portion of the window beneath the first coil, the plenum further including:
      a second air inlet at an edge portion of the top surface of the plenum to receive the airflow from the second air amplifier to reduce one or more hotspots at an edge portion of the window; and
      a third air inlet at a middle portion of the top surface of the plenum, between the center portion and the edge portion of the top surface, to receive the airflow from the third air amplifier to reduce hotspots at a middle portion of the window;
   a plurality of temperature sensors, each of the plurality of temperature sensors to measure a temperature of a corresponding portion of the window and to output a sensed temperature; and
   a controller responsive to the sensed temperatures to control the first, second, and third air amplifiers to generate the airflow.
2. The substrate processing system of claim 1, wherein the plenum is sized to cover all of the upper surface of the window.
3. The substrate processing system of claim 1, wherein the plenum comprises a plurality of plenums which cover substantially all of the upper surface of the window.
4. The substrate processing system of claim 3, wherein the plurality of plenums cover all of the upper surface of the window.
5. The substrate processing system of claim 1, wherein the plenum has an additional air inlet at an edge portion of the top surface of the plenum, the first air amplifier to provide airflow to both the first air inlet and the additional air inlet.

6. The substrate processing system of claim 1, further comprising an additional air amplifier, wherein the plenum has an additional air inlet, the first air amplifier to provide airflow to the first air inlet and the additional air amplifier to provide airflow to the additional air inlet.

7. The substrate processing system of claim 1, further comprising:
a second coil positioned above the plenum, the second coil to provide electromagnetic energy to ionize the plasma processing gases in the processing chamber.

8. The substrate processing system of claim 7, wherein the first and second coils are conductively coupled with one another.

9. The substrate processing system of claim 1, wherein the plenum has a first air outlet at the top surface.

10. The substrate processing system of claim 1, wherein the plenum has a first air outlet in one of the side walls.

11. The substrate processing system of claim 1, further comprising a source of air and first and second valves connected to the source of air, the first air amplifier connected to the source of air through the first and second valves, the controller to control the source of air and the first and second valves to provide the airflow, the first valve providing relatively low airflow, and the second valve providing relatively high airflow.

12. A substrate processing system comprising:
a processing chamber having a window at a top portion thereof and covering the processing chamber;
a plurality of coils positioned above the window to generate electromagnetic energy to ionize plasma processing gas in the processing chamber;
a plurality of air amplifiers to generate airflow;
a plenum positioned beneath the plurality of coils and above the window, the plenum having side walls and also having a top surface substantially equal in area to an area of an upper surface of the window, the top surface having a plurality of air inlets to receive the airflow from the plurality of air amplifiers and distribute the airflow across the window within the side walls of the plenum so as to reduce one or more hotspots in one or more areas of the window beneath the plurality of coils;
wherein the plurality of air inlets include:
a first air inlet positioned at about a center portion of the top surface of the plenum to receive the airflow from a first one of the air amplifiers and includes multiple holes to reduce hotspots at a center portion of the window;
a second air inlet at an edge portion of the top surface of the plenum to receive the airflow from a second one of the air amplifiers to reduce hotspots at an edge portion of the window; and
a third air inlet at a middle portion of the top surface of the plenum between the center and edge portions to receive the airflow from a third one of the air amplifiers to reduce hotspots at a middle portion of the window;
a plurality of temperature sensors, each of the plurality of temperature sensors to measure a temperature of a corresponding portion of the window and to output a sensed temperature; and
a controller responsive to the sensed temperatures to control the plurality of air amplifiers.

13. The substrate processing system of claim 12, wherein the plenum is sized to cover all of the upper surface of the window.

14. The substrate processing system of claim 12, wherein the plenum comprises a plurality of plenums which cover substantially all of the upper surface of the window.

15. The substrate processing system of claim 14, wherein the plurality of plenums cover all of the upper surface of the window.

16. The substrate processing system of claim 12, wherein the plurality of air amplifiers are equal in number to the plurality of air inlets.

17. The substrate processing system of claim 12, wherein the plurality of air amplifiers are fewer than the plurality of air inlets, and wherein two or more of the plurality of air inlets share an air amplifier.

18. The substrate processing system of claim 12, wherein the plurality of coils are conductively coupled to each other.

19. The substrate processing system of claim 12, further comprising a source of air and a plurality of pairs of valves connected to the source of air, each of the plurality of air amplifiers connected to the source of air through one of the plurality of pairs of valves, the controller to control the source of air and the plurality of pairs of valves to provide the airflow, wherein a first valve in each of the plurality of pairs of valves provides relatively low airflow, and a second valve in each of the plurality of pairs of valves provides relatively high airflow.

* * * * *